United States Patent [19]
Tanaka

[11] Patent Number: 5,500,821
[45] Date of Patent: Mar. 19, 1996

[54] SEMICONDUCTOR MEMORY DEVICE

[75] Inventor: Tomoharu Tanaka, Yokohama, Japan

[73] Assignee: Kabushiki Kaisha Toshiba, Kawasaki, Japan

[21] Appl. No.: 386,179

[22] Filed: Feb. 9, 1995

Related U.S. Application Data

[63] Continuation of Ser. No. 308,421, Sep. 19, 1994, abandoned.

[30] Foreign Application Priority Data

Sep. 20, 1993 [JP] Japan ..................... 5-233657

[51] Int. Cl.⁶ .................. G11C 7/00; G11C 8/00
[52] U.S. Cl. .............. 365/200; 365/201; 365/189.07; 365/230.01
[58] Field of Search ................. 365/200, 201, 365/189.07, 210, 221, 230.01

[56] References Cited

U.S. PATENT DOCUMENTS

| | | | |
|---|---|---|---|
| 4,701,887 | 10/1987 | Ogawa ..................... | 365/200 |
| 4,862,416 | 3/1989 | Takguni ..................... | 365/200 |
| 4,959,812 | 9/1990 | Momodomi et al. ........... | 365/185 |
| 4,989,181 | 1/1991 | Harada ..................... | 365/200 |
| 5,278,794 | 1/1994 | Tanaka et al. .............. | 365/200 |
| 5,307,316 | 4/1994 | Tavemag ................... | 365/200 |
| 5,359,559 | 10/1994 | Nomura et al. ............. | 365/200 |

FOREIGN PATENT DOCUMENTS

| | | |
|---|---|---|
| 2-226585 | 9/1990 | Japan . |
| 4-48498 | 2/1992 | Japan . |

*Primary Examiner*—Tan T. Nguyen
*Attorney, Agent, or Firm*—Oblon, Spivak, McClelland, Maier & Neustadt

[57] ABSTRACT

A semiconductor memory device where the sequence of addresses in an access operation is predetermined, comprises a memory cell array with a redundant section, a data latch circuit for writing and reading into and from the memory cell array, and a redundant-section select circuit for storing the address one cycle before a cycle in which accessing is effected according to the address of a defective memory cell, comparing what is stored with the input address signal, and outputting relief information indicating whether they coincide with each other, wherein the relief information from the redundant-section select circuit is outputted after one cycle at the same time that the address signal is switched. This makes it possible to relieve defective memory cells without lengthening the access time, thereby enabling high-speed data input and output.

19 Claims, 15 Drawing Sheets

SEMICONDUCTOR MEMORY DEVICE

This application is a continuation of application Ser. No. 08/308,421, filed on Sep. 19, 1994, now abandoned.

BACKGROUND OF THE INVENTION

1. Field of the Invention

The present invention relates to a semiconductor memory device and, more particularly, to a semiconductor memory device with redundant memories for relieving defective memories.

2. Description of the Related Art

It is well-known that conventional DRAMs, SRAMs, and EEPROMs are provided with a redundant memory for relieving defective cells. For instance, a 64-Mbit memory, which contains more than 67 million memory cells, is provided with a redundant memory composed of auxiliary memory cells. In order to enable the memory device to function as a 64-Mbit memory even if several memory cells fail, the auxiliary memory cells are replaced with the defective memory cells. The memory device also contains ROMs which, in general, are composed of polysilicon fuses, for storing the addresses of defective cells. Defective-cell addresses are stored by cutting off the fuses. The circuit of the memory device is designed such that the redundant memory is accessed in case where the address signal coincides with the defective-cell address when the stored defective-cell address is compared with the address signal.

FIG. 1 is a timing chart showing the timing for selecting a redundant column in a conventional memory cell array. Defective-column addresses are stored in the redundant-section select circuit in the form of fuses. This causes a time lag $t_{AR}$ from when the address signal has been outputted until it is sensed whether or not the redundant section is selected and then a redundant-section select signal and a redundant-column address signal are outputted. In FIG. 1, $t_{RS}$ is the time from when the redundant-section select signal or redundant-column address signal is outputted until the column is activated, $t_{SH}$ is the column activating time, and $t_{SA}$ is the time from when the column is inactivated until the next column address signal is outputted.

However, with the conventional circuit configuration of the memory device, because it is sensed whether the address is to be used for a defective cell after the address signal has been determined, there is a waiting time between the determination of the address and memory accessing. This makes the access time longer, thus retarding the input and output of the data. As described above, with the conventional semiconductor memory device, use of a circuit for relieving defective memory cells makes the access time longer, giving rise to the problem of being unable to input and output data at high speeds.

SUMMARY OF THE INVENTION

It is an object of the present invention to provide a semiconductor memory device capable of relieving defective memory cells without lengthening the access time and capable of high-speed data input and output.

According to an aspect of the present invention, there is provided a semiconductor memory device comprising: a memory cell array in which memory cells are arranged in a matrix fashion and an order of their addresses is determined in advance when being accessed; redundant memory cells which are to be replaced with defective memory cells in the memory cell array for relieving the defective memory cells; means for storing the address n cycles previous to a cycle to be accessed according to the address of the defective memory cell in the memory cell array; means for comparing the address stored in the address storing means with the address signal, and outputting relief information indicating that the redundant memory cells are accessed instead of the memory cells when they coincide with each other; means for outputting the relief information to the cycle accessed according to the address of the defective memory cells; and means for accessing serially the memory cells according to addresses of predetermined order, and accessing the defective memory cells according to the relief information instead of the memory cells when the relief information are outputted.

According to another aspect of the present invention, there is provided a semiconductor memory device comprising: a memory cell array in which memory cells are arranged in a matrix fashion and an order of their addresses is determined in advance when being accessed; redundant memory cells which are to be replaced with defective memory cells in the memory cell array for relieving the defective memory cells; means for generating the address signal automatically in predetermined order according to the address n cycles previous to the address of the initial cycle to be accessed; means for storing the address n cycles previous to a cycle to be accessed according to the address of the defective memory cell in the memory cell array; means for comparing the address stored in the address storing means with the address signal, and outputting relief information indicating that the redundant memory cells are accessed instead of the memory cells when they coincide with each other; means for outputting the relief information to the cycle accessed according to the address of the defective memory cells; and means for accessing serially the memory cells according to addresses of predetermined order, and accessing the defective memory cells according to the relief information instead of the memory cells when the relief information are outputted.

According to still another aspect of the present invention, there is provided a semiconductor memory device comprising: a memory cell array in which memory cells are arranged in a matrix fashion and an order of their addresses is determined in advance when being accessed; redundant memory cells which are to be replaced with defective memory cells in the memory cell array for relieving the defective memory cells; means for generating the address signal automatically in predetermined order according to the address n cycles previous to the start address of the initial cycle to be accessed; means for setting the address n cycles previous to the start address as an initial address; means for storing the address n cycles previous to a cycle to be accessed according to the address of the defective memory cell in the memory cell array; means for comparing the address stored in the address storing means with the address signal, outputting relief information indicating that the redundant memory cells are accessed instead of the memory cells when they coincide with each other, and detecting the relief information of n cycles including the start address before the access is started; means for outputting the relief information to the cycle accessed according to the address of the defective memory cells; and means for accessing serially the memory cells according to addresses of predetermined order, and accessing the defective memory cells according to the relief information instead of the memory cells when the relief information are outputted.

In the present invention, it is sensed in advance whether or not the address signal n cycles later, for example one cycle later, coincides with a defective-memory cell address, and the sensed information (relief information) is outputted after n cycles, simultaneously with the address signal. Accordingly, with the present invention, it is possible to eliminate a time required to determine whether the address signal is for defective memories after the address signal is determined. Therefore, the semiconductor memory device of the present invention can be prevent the access time from being lengthened to replace defective memory cells. The access time of a semiconductor memory device with redundant memories for relieving defective memory cells can be made almost equal to that of a semiconductor memory device without redundant memories.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

An embodiment of the present invention will be explained hereinafter referring to the accompanying drawings.

Figure 2:
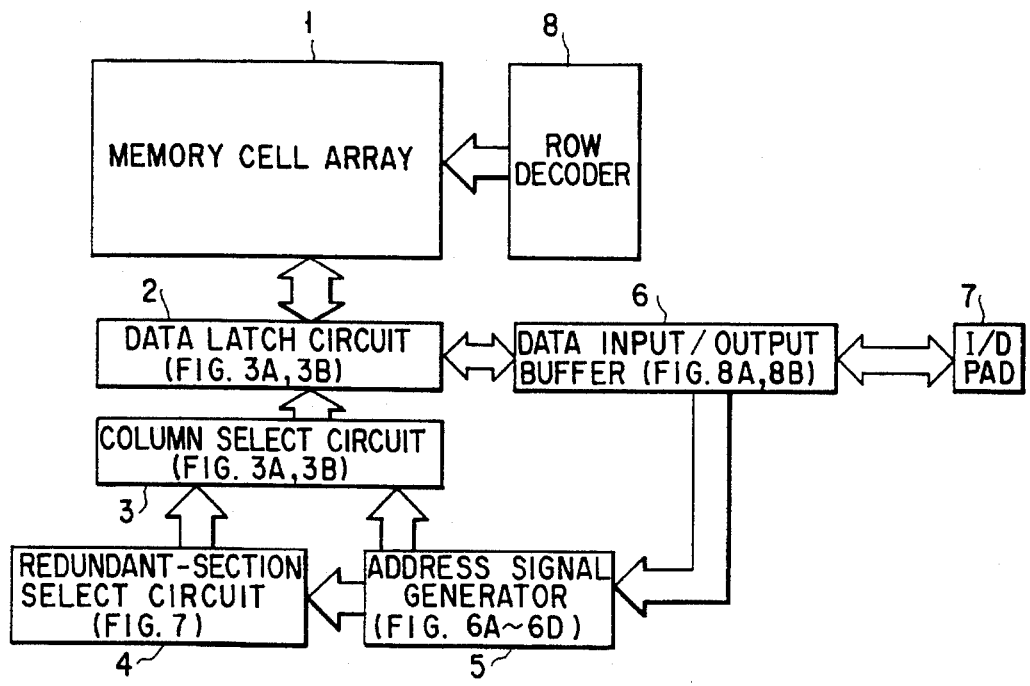
FIG. 2 is a schematic block diagram of a semiconductor memory device according to an embodiment of the present invention.

FIG. 2 is a schematic block diagram showing a structure of a semiconductor memory device according to an embodiment of the present invention. A memory cell array 1 contains a column redundant section, for example. There is provided a row decoder 8 for driving word lines of the memory cell array 1. There is provided a data latch circuit 2 which temporarily latches data to write/read data into and from the memory cell array 1. The column select circuit 3 receives address signals to select columns of the memory cell array 1. A redundant-section select circuit 4 generates a redundant-section select signal to supply the column select circuit 3 with it when the column select section should be selected, thereby inactivating the selection of columns on the basis of the address signal output from an address signal generator circuit 5. As described later, the redundant-section select circuit 4 is provided with an address storing means, a comparing means and an outputting means. The address signal for selecting a column of the memory cell 1 is generated consecutively by the address signal generator circuit 5. The initial address of the address signal is specified externally. The address signals generated by the address signal generator circuit 5 are input into the column select circuit 3 and the redundant select circuit 4. Data transfer between the data latch circuit 2 for the address selected by the column select circuit 3 and a data input/output terminal (I/O pad) 7 is effected via a data input/output buffer 6.

Figure 3A:
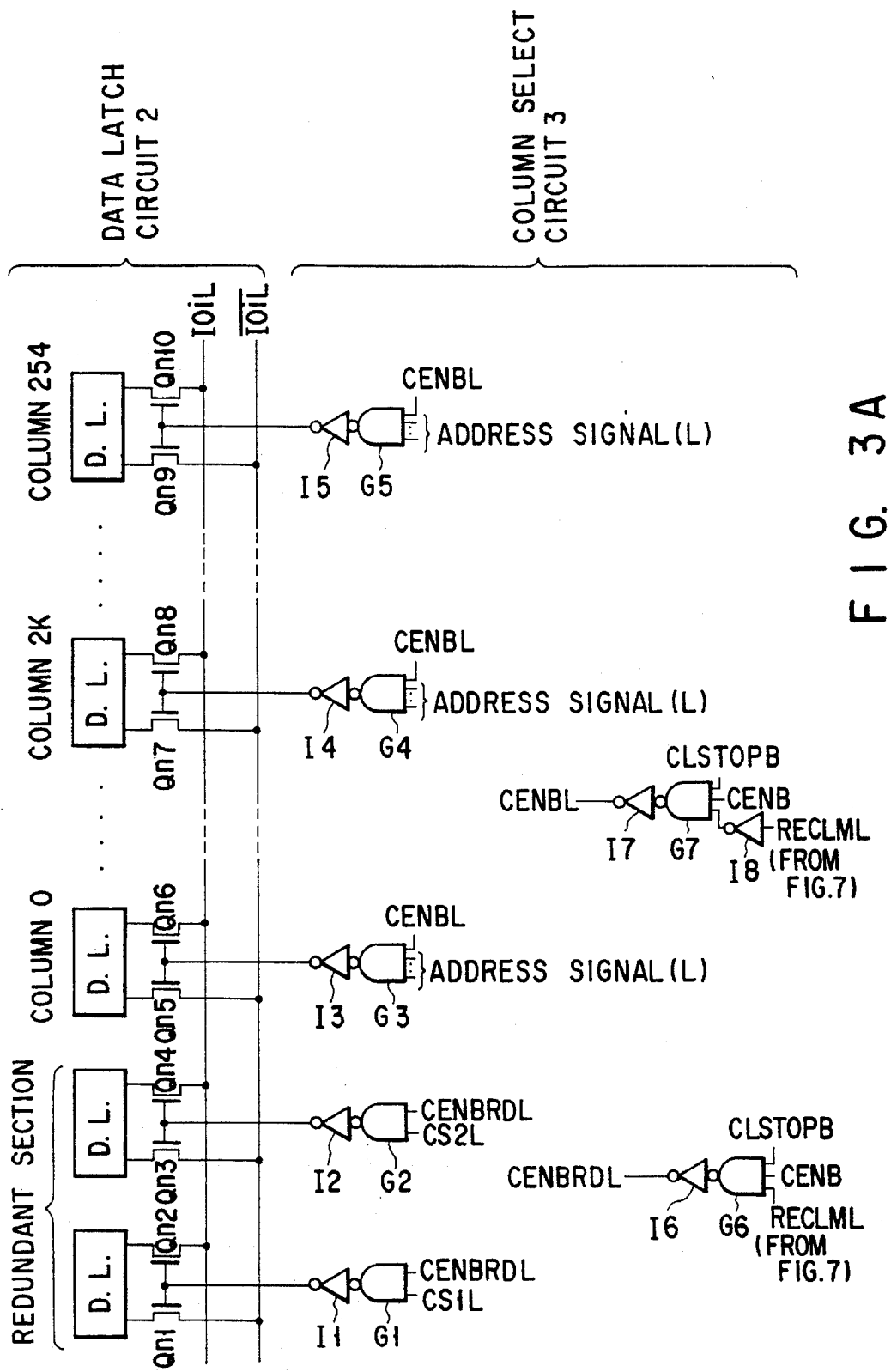
FIG. 3A shows a concrete configuration of the data latch circuit and column select circuit for even-numbered columns in the embodiment.
Figure 3B:
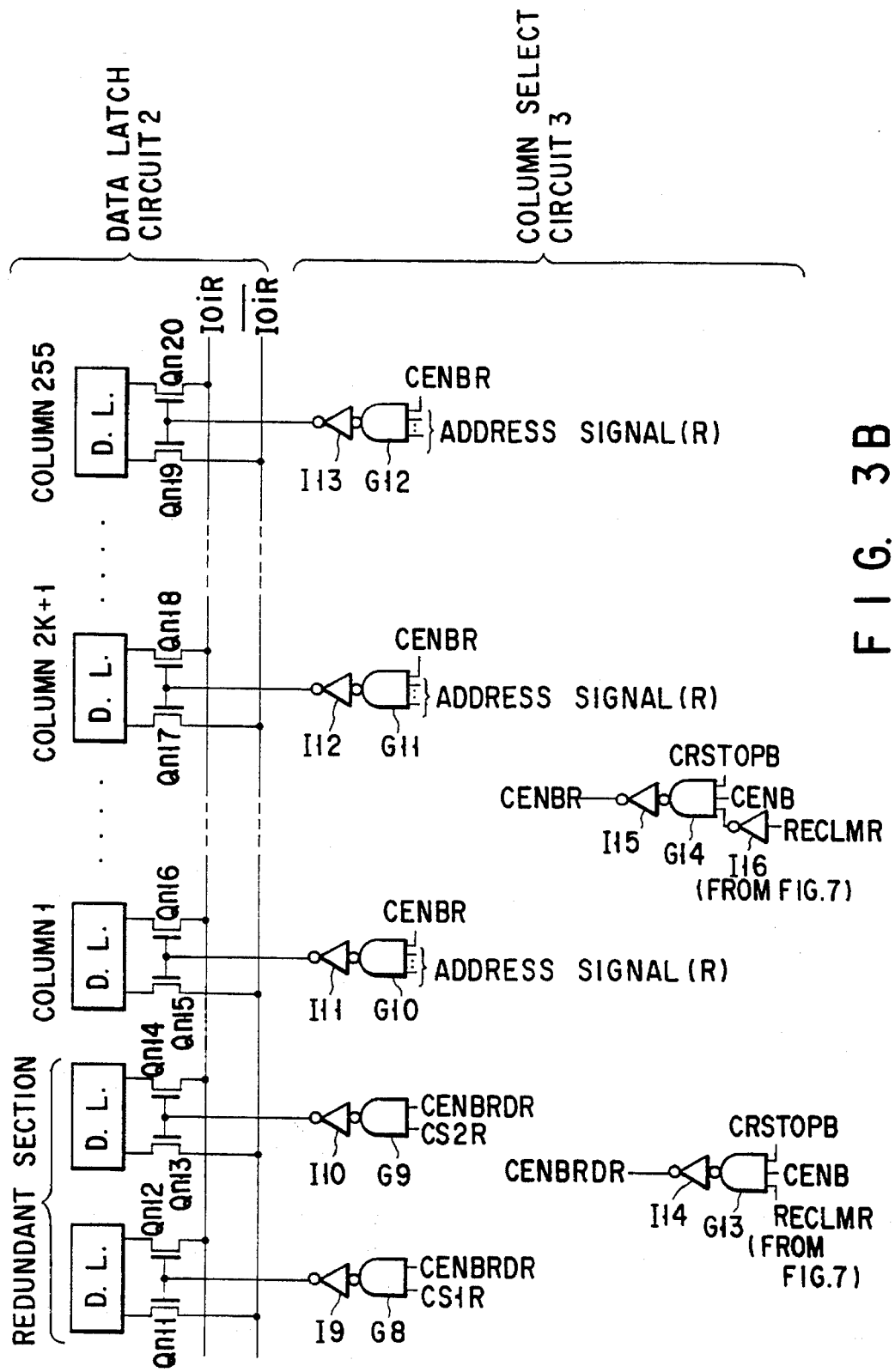
FIG. 3B shows a concrete configuration of the data latch circuit and column select circuit for odd-numbered columns in the embodiment.

FIGS. 3A and 3B are circuit diagrams showing a concrete structure of the data latch circuit section 2 containing data latch circuits (D.L.), and column select circuit 3. FIG. 3A shows a portion corresponding to I/Oi (i=0 to 7) for even-numbered column addresses. FIG. 3B shows a portion corresponding to I/Oi (i=0 to 7) for odd-numbered column addresses. The data latch circuit 2 is connected to data input/output lines IOiL, $\overline{IOiL}$, IOiR, $\overline{IOiR}$ via N-channel MOS transistors Qn1 to Qn10, and Qn11 to Qn20 serving as column select transistors. The gates of the column select transistors are designed to receive the outputs of the column select circuit 3. NAND circuits G1, G2 and inverters I1, I2 in FIG. 3A and NAND circuits G8, G9 and inverters I9, I10 in FIG. 3B, both are used to select the redundant section, receive a redundant column address signal CSKX (K=1, 2; X=L, R) and a redundant column activating signal CENBRDX (X=L, R) as inputs. NAND circuits G3 to G5 and inverters I3 to I5 in FIG. 3A and NAND circuits G10 to G12 and inverters I11 to I13 in FIG. 3B, both are used to select normal columns, receive seven signals corresponding to the addresses in address signals (x) {AiSX, $\overline{AiSX}$ (i=1 to 7; X=L, R)}, and normal column activating signal CENBX (X=L, R). A NAND circuit G6 and an inverter I6 in FIG. 3A and a NAND circuit G13 and an inverter I14 in FIG. 3B constitute circuits for outputting a redundant column activating signal CENBRDX, and receive a redundant-section select signal RECLMX (X=L, R), a column activating signal CENB, and a column select stop signal CXSTOPB (X=L, R)

as inputs, respectively. A NAND circuit G7 and inverters I7, I8 in FIG. 3A, and a NAND circuit G14 and inverters I15, I16 in FIG. 3B constitute circuits for outputting a column select signal CENBX, which differ from the outputting circuit of the redundant column activating signal CEN-BRDX in that the NAND circuit has the inverted signal of the redundant-section select signal RECLMX at an input. In this embodiment, to speed up serial accessing of columns of the memory array 1, the data latch circuits 2 for the even-numbered and odd-numbered column addresses are selected at the same time.

Figure 1:
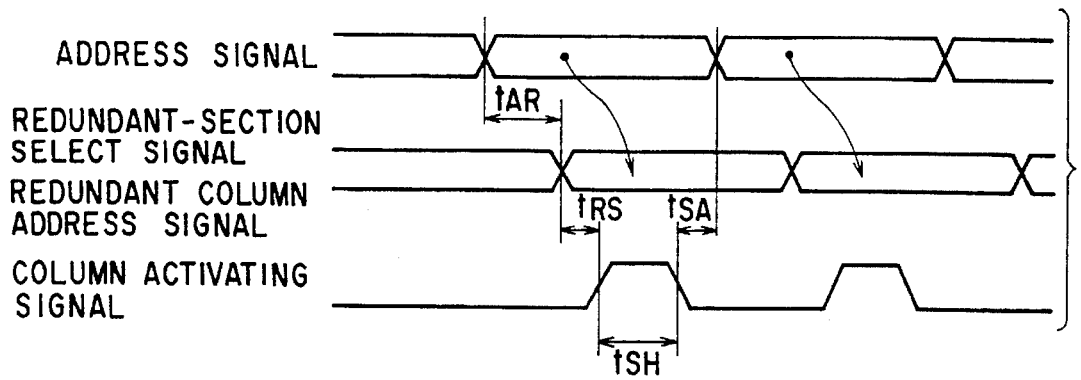
FIG. 1 is a timing chart of the timing for selecting a conventional redundant column.
Figure 4:
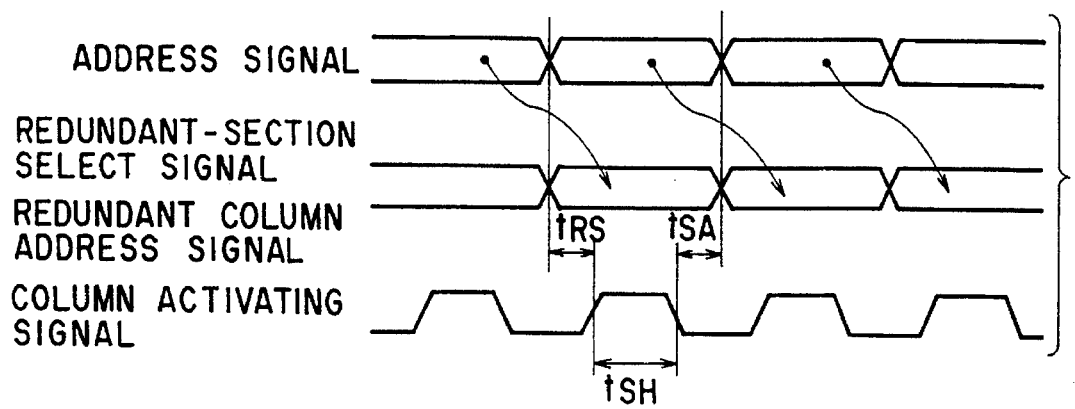
FIG. 4 is a timing chart of the timing for selecting a redundant column in the embodiment.

FIG. 4 is a timing chart showing the timing for selecting a redundant column in the embodiment of the present invention. In the present invention, the address signal, the redundant-section select signal, the redundant-column address signal, and the column activating signal are generated as shown in FIG. 4. In the embodiment, the column address of the cycle immediately before a cycle in which a defective column address is outputted is stored in the redundant-section select circuit 4. It is sensed, on the basis of the column address signal of the preceding cycle, whether or not the column address in the current cycle is defective. At the same time the address signal of the current cycle is outputted, the redundant-section select signal RECLMX and the redundant column address signal CSKX are outputted. This prevents the time lag $T_{AR}$ as shown in FIG. 1 from taking place, thereby enabling high-speed accessing.

Figure 5:
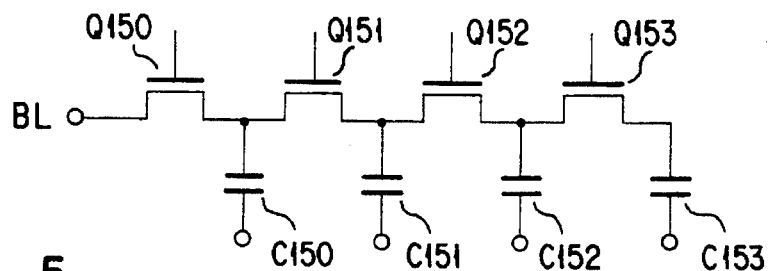
FIG. 5 is a circuit diagram showing a cell structure of a NAND type DRAM.

FIG. 5 is a circuit diagram showing a cell structure of a NAND type DRAM. In FIG. 5, cell transistors Q150–Q153 are connected to the bit line, and capacitors C150–153 are respectively coupled to the cell transistors Q150–Q153. NAND type DRAM cell may be used as the memory cell array 1 of the present invention. In addition to the DRAM cell, ROM, SRAM, EEPROM cell and other various type of semiconductor memories may be used in the present invention.

Figure 6A:
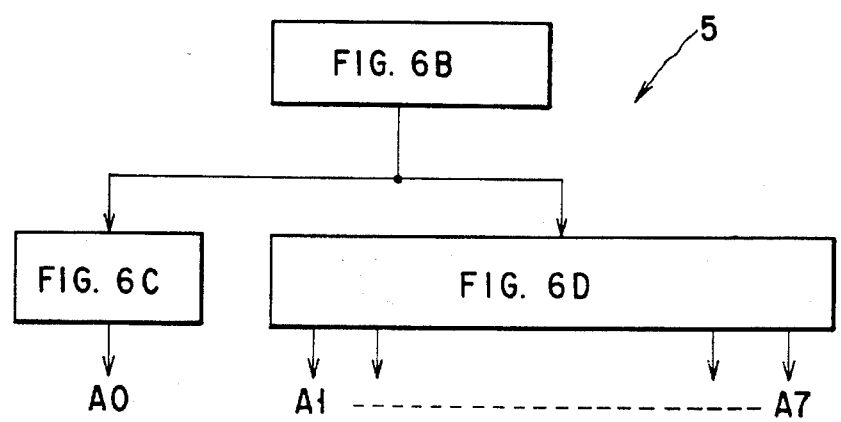
FIG. 6A is a diagram showing the relationship between FIGS. 6B to 6D of the address signal generator circuit in FIG. 2.
Figure 6B:
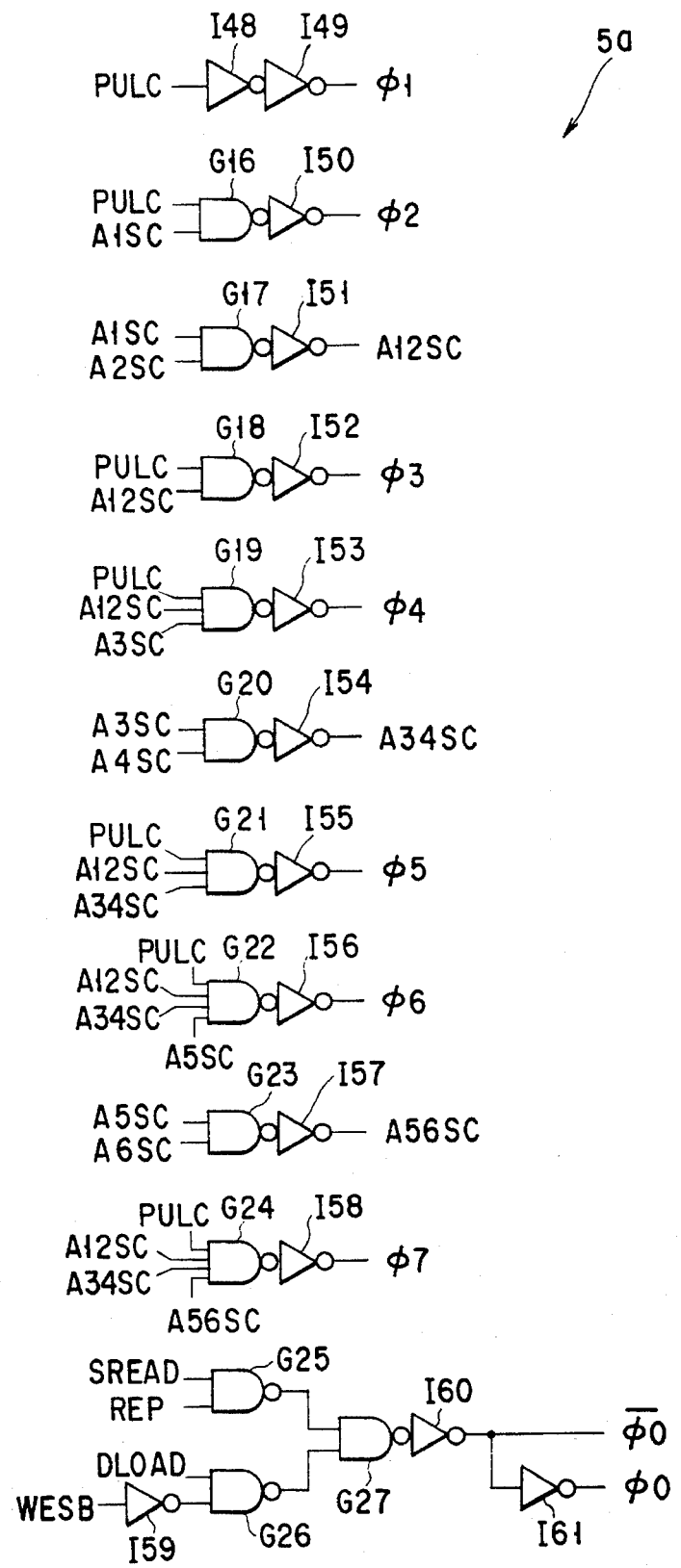
FIG. 6B is a circuit diagram of a circuit for outputting count-up pulses to an address counter in the embodiment.
Figure 6C:
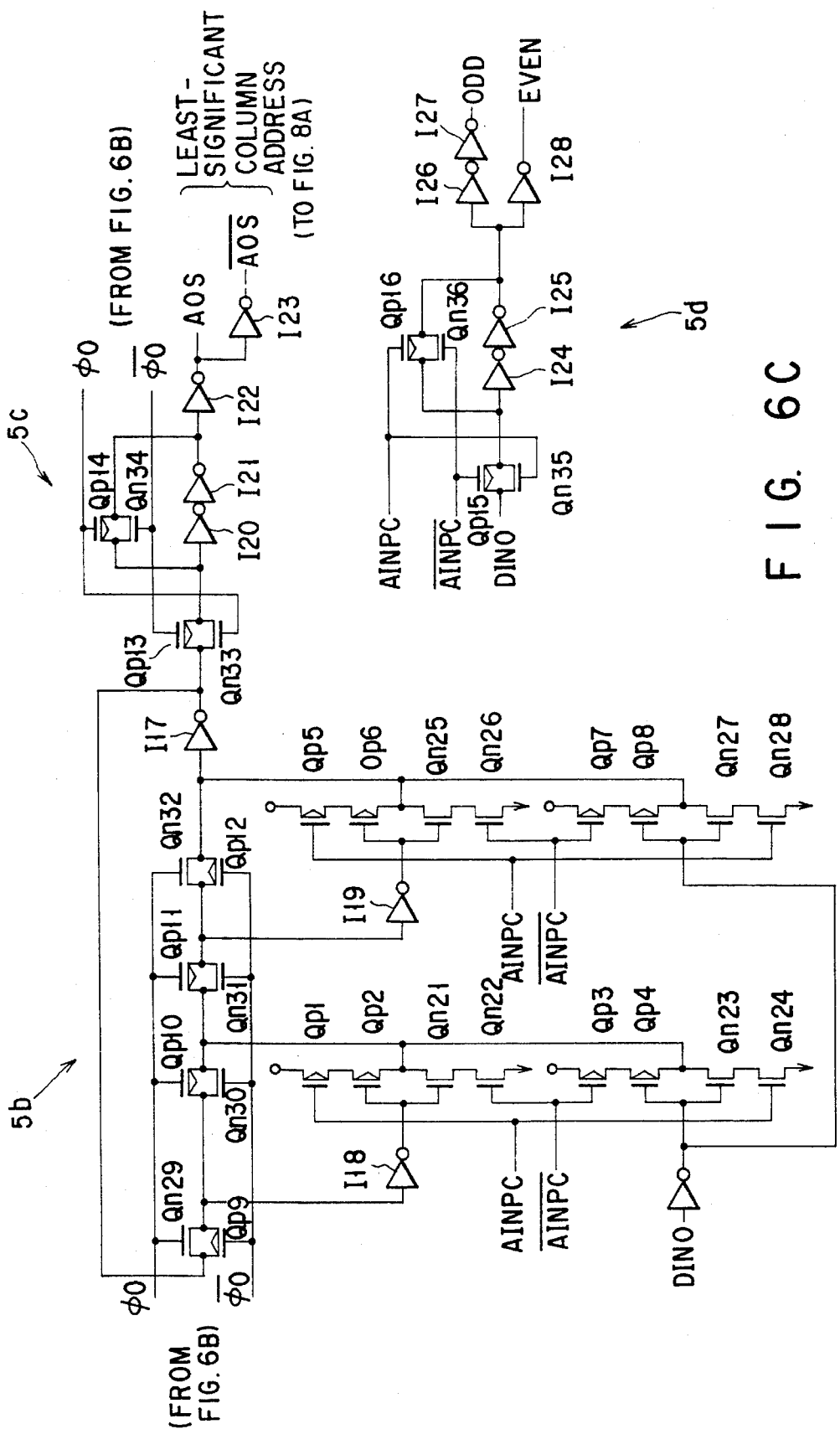
FIG. 6C is a circuit diagram of an address signal generator circuit for generating the least significant column address in the embodiment.
Figure 6D:
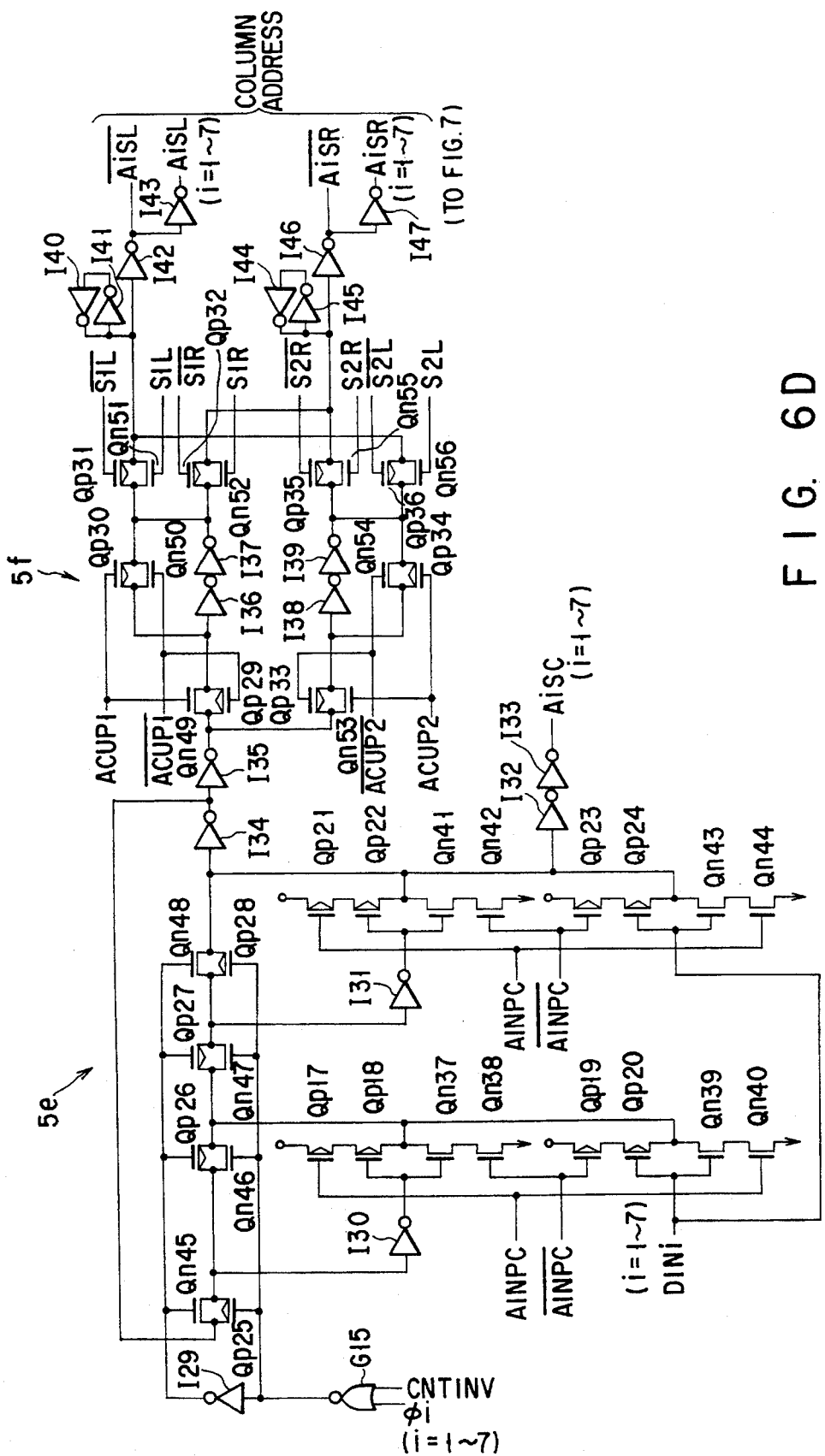
FIG. 6D is a circuit diagram of an address signal generator circuit for generating column addresses excluding that of the least significant column in the embodiment.

FIG. 6A is a diagram for explaining the relationship between FIGS. 6B to 6D showing the address signal generator circuit 5 shown in FIG. 2.

FIG. 6B is a circuit diagram showing a structure of a count-up signal output circuit 5a for outputting count-up signals φ0, $\overline{\phi0}$, φi (i=1 to 7) in a address counter used in the address signal generator circuit 5. The count-up signal φ1 is driven by a count-up pulse PULC. The count-up signals φi (i=2 to 7) are driven by the count-up pulse PULC only when all of addresses in lower-order than the i-th counter address AiSC are high. As shown at the lower end of FIG. 6B, the count-up signals φ0, $\overline{\phi0}$ are driven by a read activating signal REP during a serial read operation, and are also driven by a write activating signal WESB during a data input operation. A serial read signal SREAD is high during the serial read operation, and a data input signal DLOAD is high during the data input operation.

FIGS. 6C and 6D are circuit diagrams showing a concrete structure of the address signal generator 5. FIG. 6C is a circuit diagram showing a structure of an address signal generator circuit for generating least-significant column addresses AOS, $\overline{AOS}$ in the embodiment. This generator circuit is mainly composed of an initial value setable counter-circuit 5b and a register circuit 5c. A signal DINO is the least-significant bit of the initial address. Signals AINPC, $\overline{AINPC}$ are made high and low, respectively, to set the initial address. When the count-up signals φ0, $\overline{\phi0}$ go low and high, respectively, the counter circuit 5b counts the address up. While, when the count-up signals φ0, $\overline{\phi0}$ go high and low, respectively, a register composed of inverters I20, I21 in the register circuit 5c fetches the output from the counter circuit 5b. On the basis of the least-significant signal DINO of the initial address, a register 5d composed of inverters I24, I25 stores whether the initial address is odd or even and outputs correspondingly either an odd signal or an even signal.

FIG. 6D is a circuit diagram showing a structure of an address signal generator circuit for generating column address signals AiSX, $\overline{AiSX}$ (i=1 to 7; X=L, R) except for the least significant column in the embodiment. This generator circuit is mainly made up of an initial-value setable counter circuit 5e and a register circuit 5f. A signal DINi (i=1 to 7) is initial-address data and is input into the counter circuit 5e. The count-up signal φi (i=1 to 7) and the count address inverted signal CNTINV are also input into the counter circuit 5e. Signal AiSC (i=1 to 7) is a counter address. Signals ACUP1, $\overline{ACUP1}$ are signals used to allow a register (R1) composed of inverters I36 and I37 in the register circuit 5e to take in the counter output from the counter circuit 5e. When signals ACUP1, $\overline{ACUP1}$ go high and low, respectively, the register circuit 5f fetches the counter output from the counter circuit 5e. On the other hand, when signals ACUP1, $\overline{ACUP1}$ go low and high, respectively, the register circuit 5f latches the counter output. Signals ACUP2, $\overline{ACUP2}$ are signals used to allow a register (R2) composed of inverters I38 and I39 of the register circuit 5f to take in the counter output of the counter 5e. Signals SKX, $\overline{SKX}$ (K=1, 2; X=L, R) are used to supply the output of register RK (K=1, 2) as address signals AiSX, $\overline{AiSX}$ (X=L, R). For instance, when the signal SIL goes high and the signal $\overline{SIL}$ goes low, the output of register (R1) is supplied as the column addresses AiSL, $\overline{AiSL}$.

Figure 7:
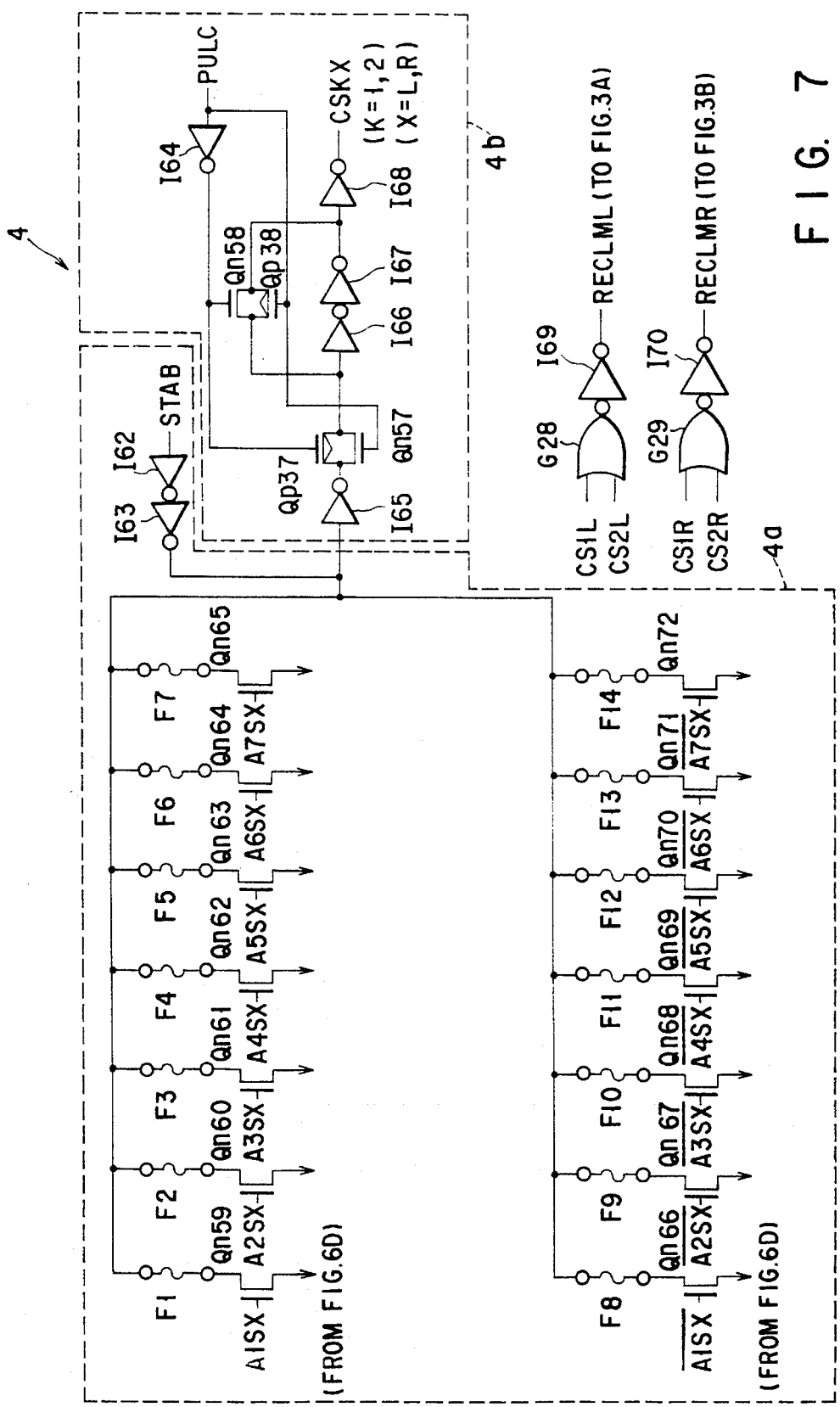
FIG. 7 is a circuit diagram of the redundant-section select circuit in the embodiment.

FIG. 7 is a circuit diagram showing a concrete structure of the redundant-section select circuit 4 of FIG. 2, where reference numeral 4a indicates an address storing circuit (an address comparator circuit), and reference numeral 4b indicates an output circuit. The address storing circuit 4a is used to store the address n cycles in advance of the access cycle based on the address of the defective memory cell, and is provided with ROMs, which are composed of fuses F1 to F14 made of polysilicon, for storing the address. In general, the address is stored by cutting off the fuse. The address storing circuit 4a is designed to compare the address stored in the fuses F1 to F14 with input address signals, and to access the redundant memory when the input address signals coincide with the stored address. That is, this address storing circuit 4a serves as an address comparator circuit which compares contents stored in the fuses F1 to F14 with the input address signals AiSX, $\overline{AiSX}$ (i=1 to 7, X=L, R), and outputs a relief information indicating whether or not they coincide with each other. As described above, the address storing circuit 4a detects the relief information n cycles in advance of the access cycle. The output circuit 4b outputs the relief information detected n cycles before to a corresponding access cycle.

In detail, the gates of N-channel MOS transistors Qn59 to Qn65 of the address storing circuit 4a are supplied with the column address signals AiSX (i=1 to 7; X=L, R), and the gates of N-channel MOS transistors Qn66 to Qn72 of the address storing circuit 4a are supplied with the column address signals $\overline{AiSX}$ (i=1 to 7; X=L, R). If a defective-column address is an even number and is "00000000", for instance, the even numbered column address one cycle immediately before the current cycle is "11111110." Thus, fuses F1 to F7 in the redundant-section select circuit 4 with X=L are cut off. If an odd numbered defective-column address is "01010101," the column address one cycle immediately before the current cycle is "01010011." Thus, fuses F1, F4, F6, F9, F10, F12, F14 in the redundant-section select circuit with X=R are cut off. In the embodiment, address signals AiSX, $\overline{\text{AiSX}}$ (i=1 to 7; X=L,R) are generated consecutively at the counter for simultaneous accessing to even-numbered column addresses and odd-numbered column addresses. To do this, in the redundant-section select circuit 4 corresponding to the least-significant one of defective column addresses, the fuse corresponding to the column address of the preceding cycle is cut off. In the embodiment, up to two columns can be relieved for each of the odd-numbered column group and the even-numbered column group. The redundant-section select circuit 4 is activated when the signal STAB goes high. When the count-up pulse PULC goes high one cycle before the defective-column address occurs, the redundant-column address signal CSKX (K=1, 2; X=L, R) goes high. When the address signal CS1X or CS2X goes high, a NOR circuit 28 and an inverter I69 or a NOR circuit G29 and an inverter I70 make the redundant-section select signal RECLMX high (X=L, R). As a result, the redundant column shown in FIGS. 3A and 3B is selected instead of the defective column. The data latch circuit 2, the column select circuit 3, the redundant-section select circuit 4 and the address signal generation circuit 5 serves as an access means which accesses the memory cells serially in accordance with the addresses in previously determined order.

Figure 8A:
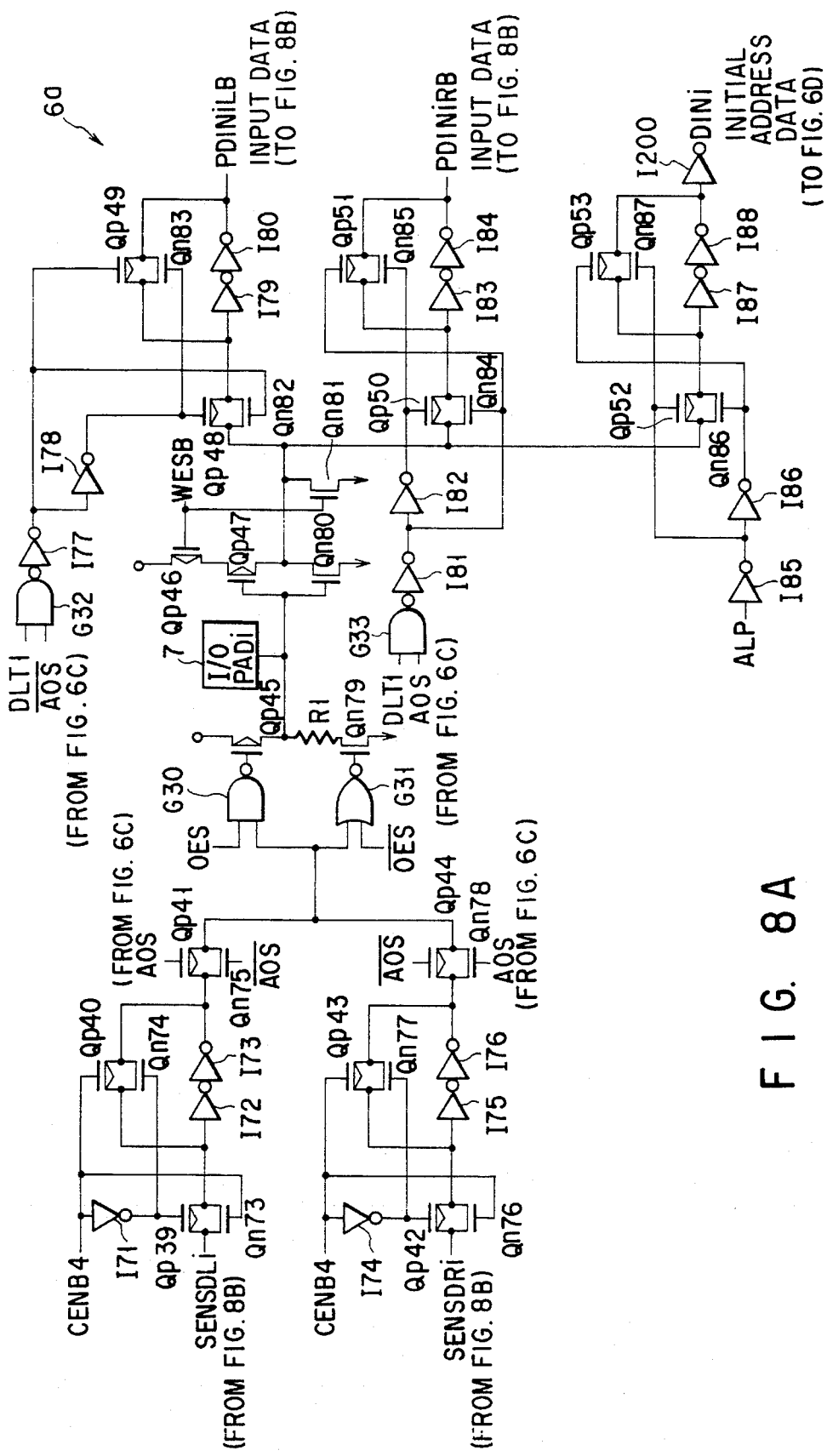
FIG. 8A is a circuit diagram of the data input/output buffer in the embodiment.
Figure 8B:
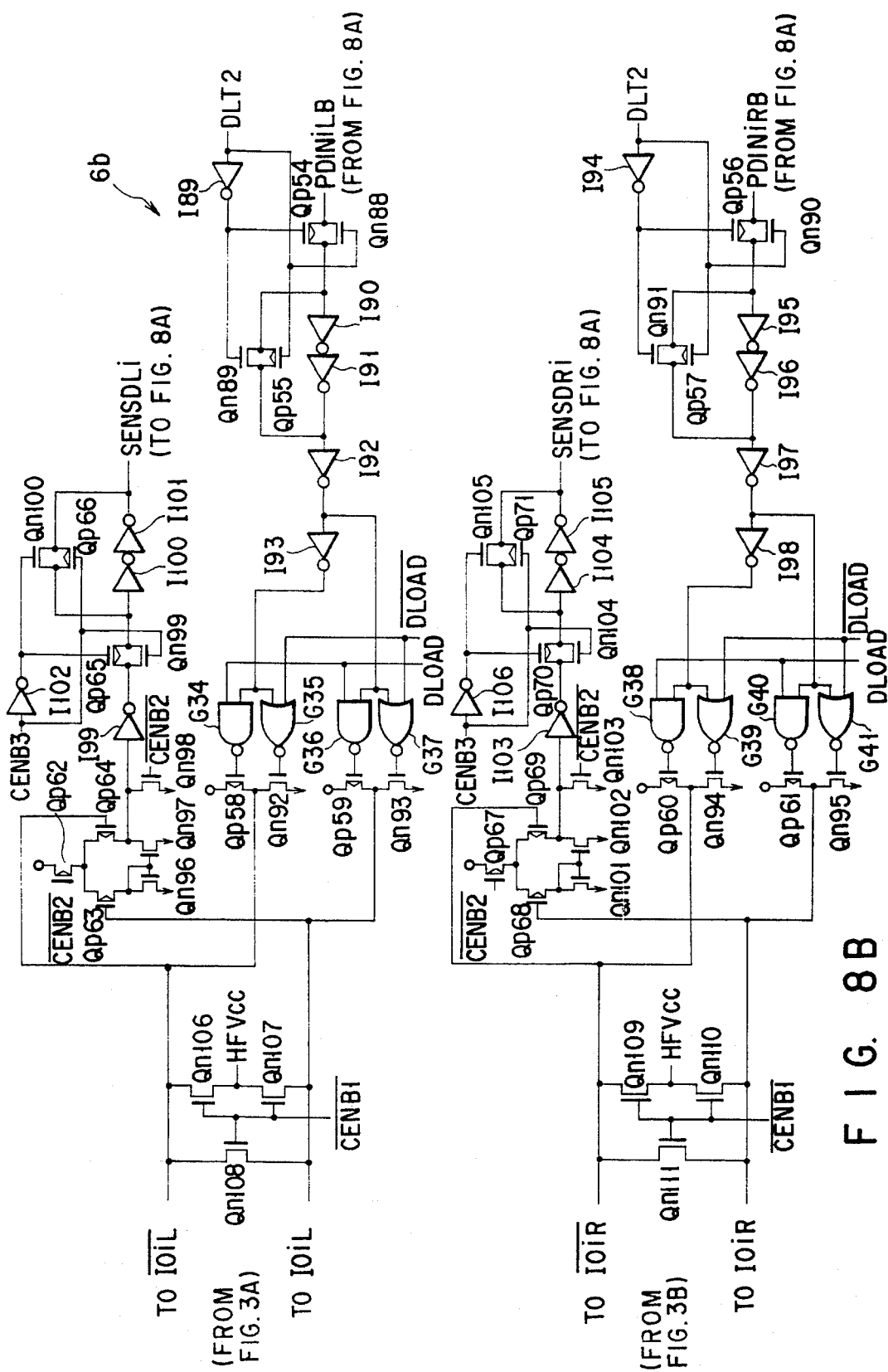
FIG. 8B is a circuit diagram of the data input/output buffer in the embodiment.

FIGS. 8A and 8B are circuit diagrams illustrating a concrete structure of the data input/output buffer 6 in FIG. 2. In case where data are input into the memory cell array 1, the data inputted into the input/output pad I/O PADi (i=0 to 7) 7 shown in FIG. 8A is accepted when the write activating signal WESB goes low. At this time, when the address data latch pulse ALP shown at the bottom in FIG. 8A is high, the input data is the initial value, i.e., initial address data DINi (i=0 to 7) of the address counter. When the data latch pulse DLT1 is high and the least-significant column address AOS is high, the input data is latched in the register composed of inverters I79, I80 as the data for a column corresponding to an even-numbered address, and is output as the input data PDINiLB. When the data latch pulse DLT1 is high and the least-significant column address AOS is high, the input data is latched in the register composed of inverters I83, I84 as the data for a column corresponding to an odd-numbered address, and is output as the input data PDINiRB. In FIG. 8A, the data latch pulse DLT2 goes high, allowing the input data PDINiLB to be transferred to registers composed of inverters I90, I91 and the input data PDINiRB to be transferred to registers composed of inverters I95, I96. When data input signals DLOAD, $\overline{\text{DLOAD}}$ are high and low, respectively, the input data is outputted from the data input/output buffer 6 to the data latch circuit D.L. through the data input/output lines IOiL, $\overline{\text{IOiL}}$, and IOiR, $\overline{\text{IOiR}}$. Thereafter, the input data are written into the memory cell array 1.

Next, in case where data are read from the memory cell array 1, first the signal $\overline{\text{CENB1}}$ goes low, canceling the equalization of the data input/output lines IOiX, $\overline{\text{IOiX}}$ (i=0 to 7; S=L, R). Data are outputted from the data latch circuit 2 in FIGS. 3A and 3B to the data input/output lines IOiX, $\overline{\text{IOiX}}$. When the signal CENB2 goes low, the data are sensed at current mirror circuits composed of N-channel MOS transistors Qn96, Qn97, Qn101, Qn102, and P-channel MOS transistors Qp62, Qp63, Qp64, Qp67, Qp68, Qp69 in FIG. 8B. The sensed data is latched in registers composed of inverters I100, I101 as the data SENSDLi and in registers composed of inverters I104, I105 as the data SENSDRi when the signal CENB3 goes high. It is then transferred to registers composed of inverters I72, I73 and I75, I76 when the signal CENB4 in FIG. 8A goes high. The data SENSDLi and SENSDRi are selectively outputted by least-significant column address signals AOS, $\overline{\text{AOS}}$ from the registers, and outputted to the input/output pad I/O PADi (i=0 to 7) 7 when the output circuit activating signals OES, $\overline{\text{OES}}$ go high and low, respectively.

Figure 9A:
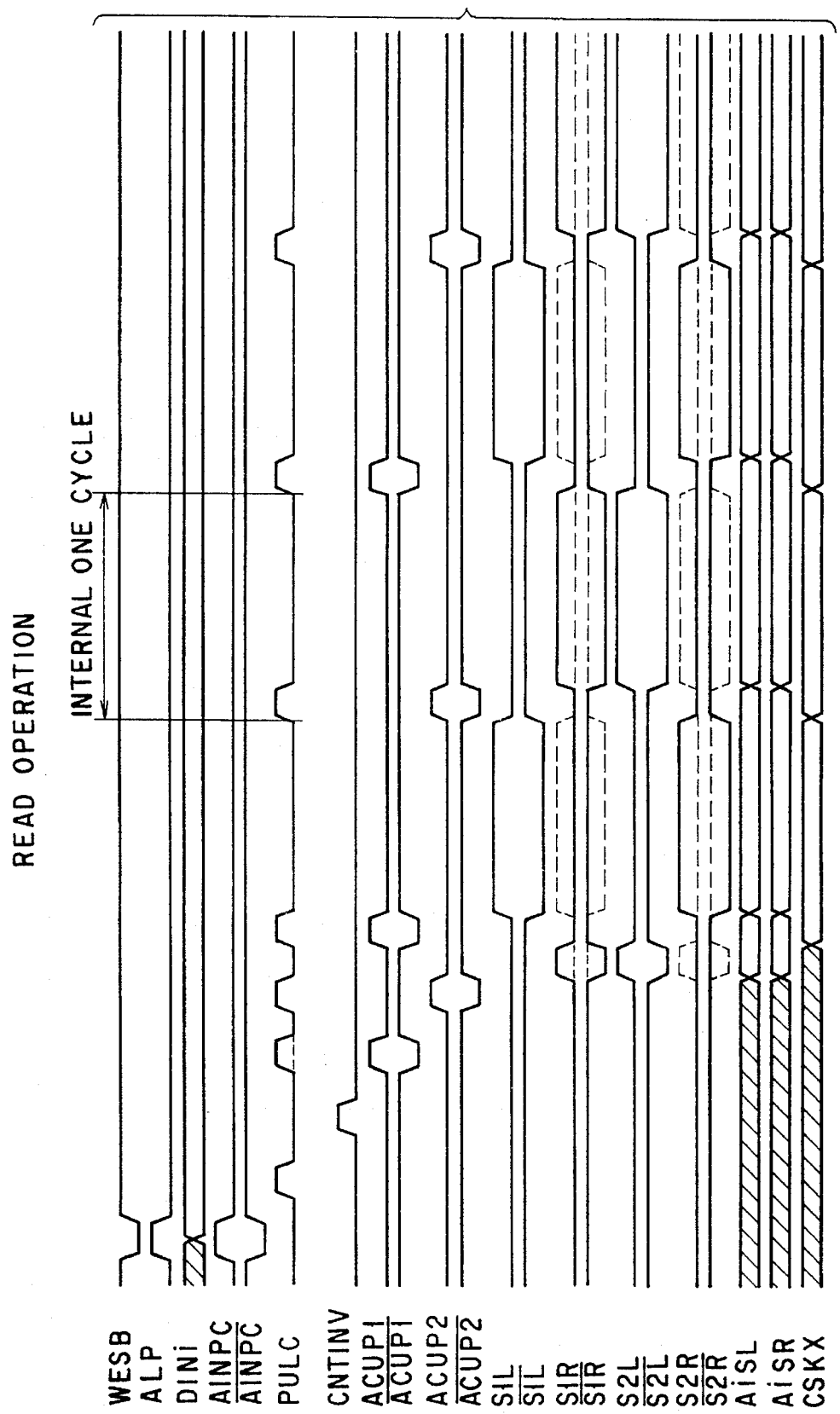
FIG. 9A is a timing chart for the data read operation in the embodiment.
Figure 9B:
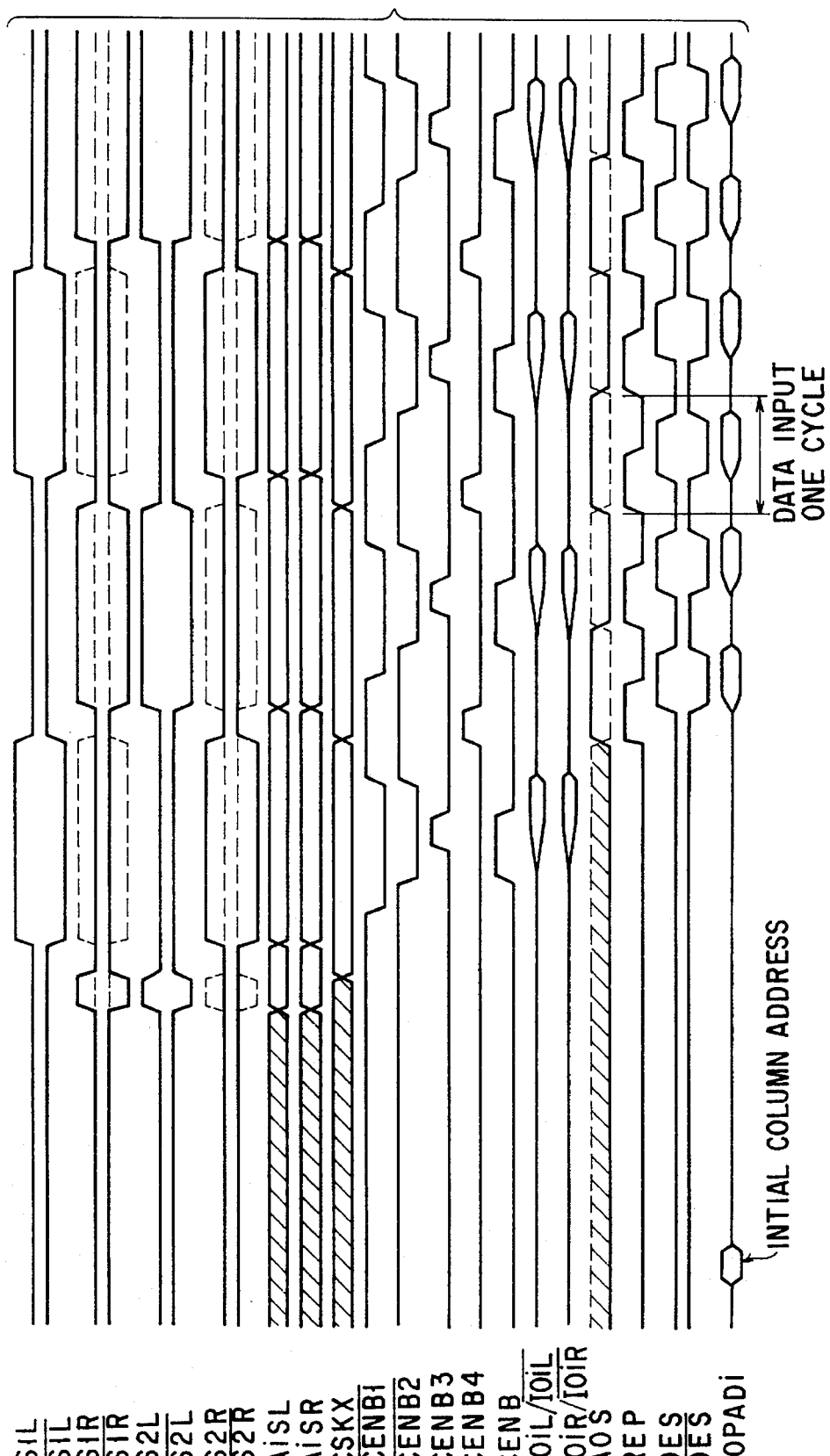
FIG. 9B is a timing chart for the data read operation in the embodiment.
Figure 10A:
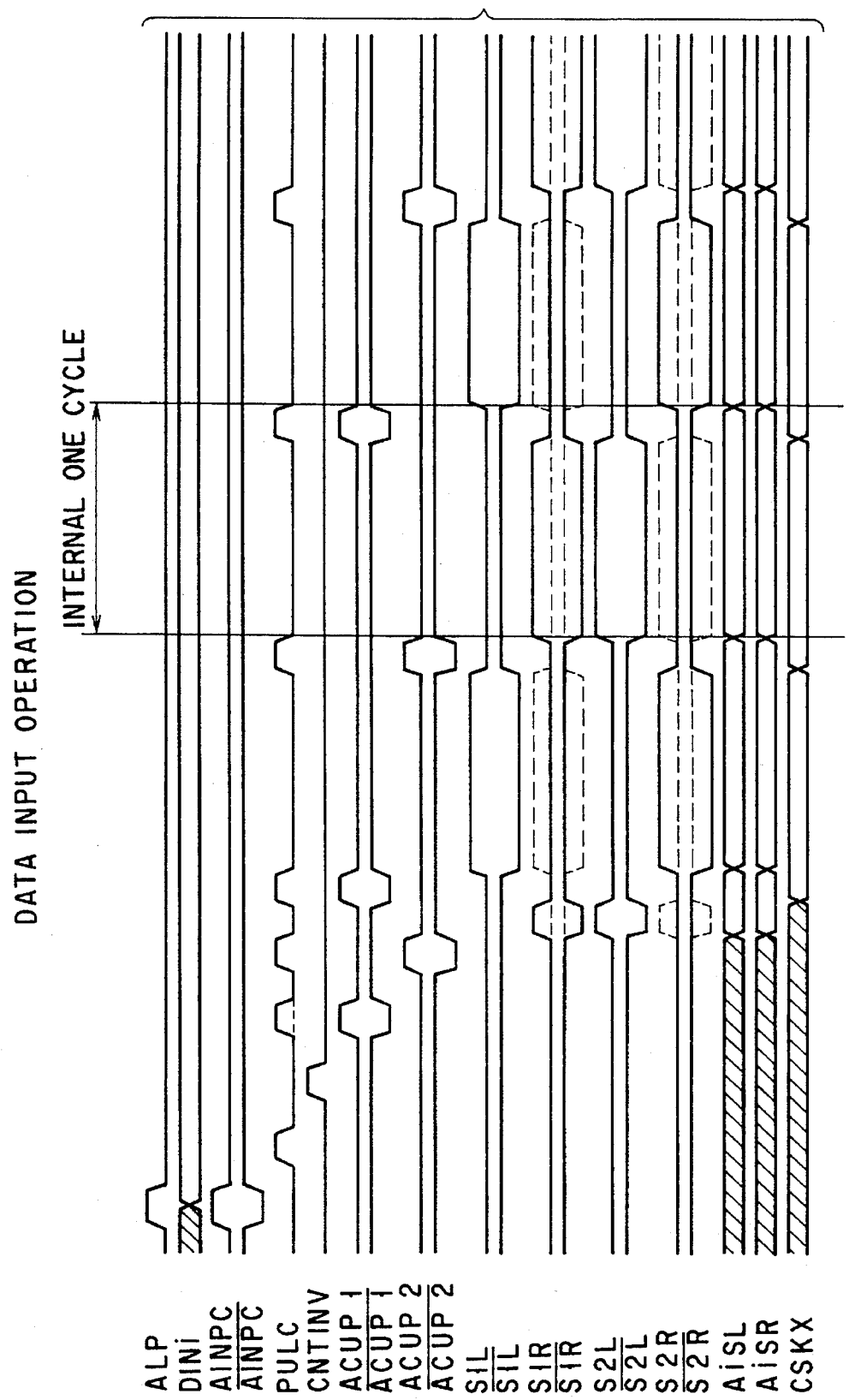
FIG. 10A is a timing chart for the data input operation in the embodiment.
Figure 10B:
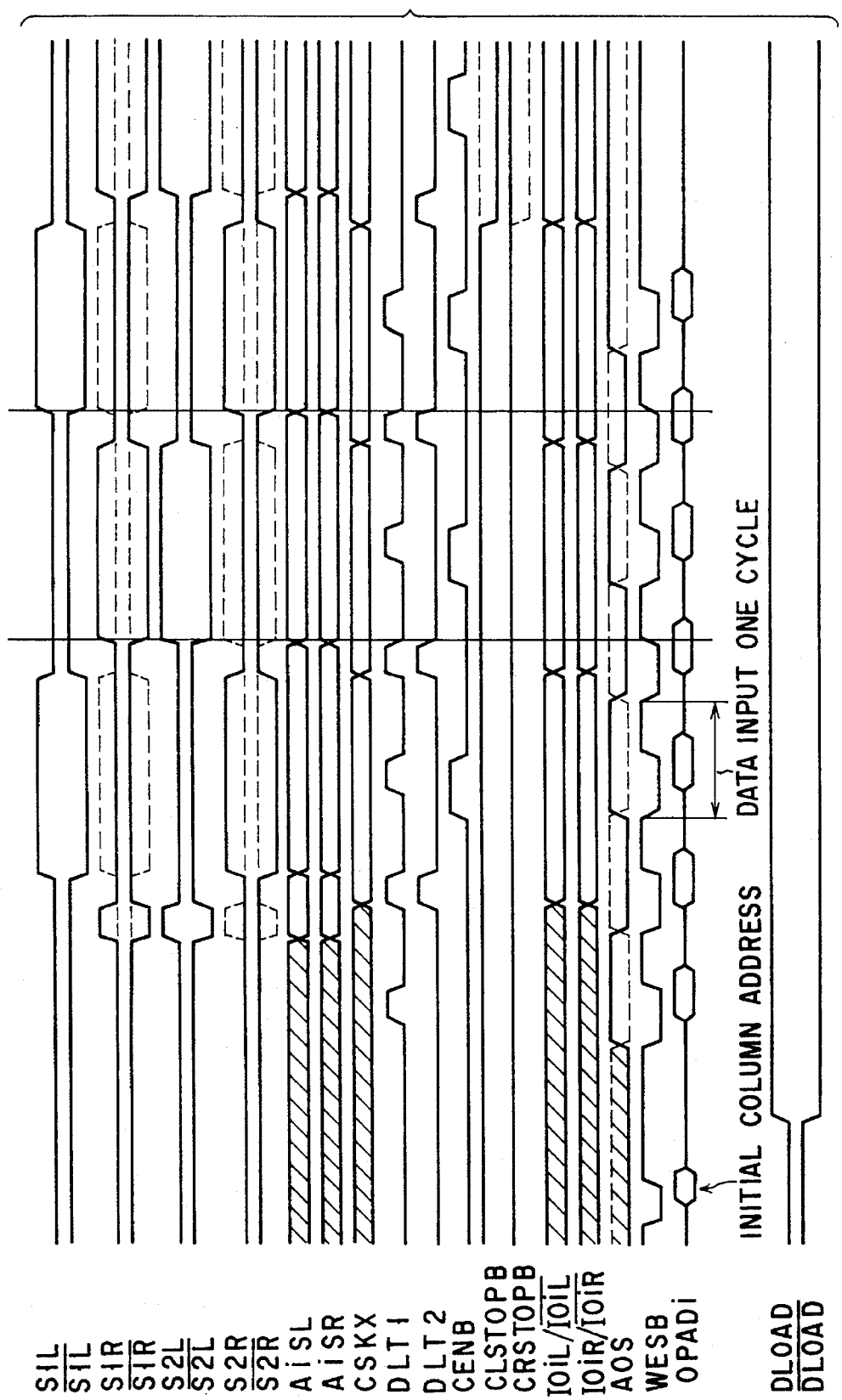
FIG. 10B is a timing chart for the data input operation in the embodiment.

An operation of a semiconductor memory device thus constructed will be explained, referring to FIGS. 9A to 10B. FIGS. 9A and 9B are timing charts for the read operation. FIGS. 10A and 10B are timing charts for the data input operation. In these figures, solid lines indicate the operation when the start address is for an odd-numbered column and dotted lines indicate the operation when the start address is for an even-numbered column.

First, a read operation will be explained. In advance of the data read operation, the column address is set at an address (dummy address) one cycle previous to the initial column address. In FIG. 9A, at the rising of the write activating signal WESB, the data at external terminal I/O PADi (i=0 to 7) 7 is fetched as the initial column address (FIG. 8A). Inverted data is initially set by the address counter 5e (FIG. 6D) for addresses A1SC to A7SC. Then, the count-up pulse PULC is outputted and a counter address inverted signal CNTINV is outputted. This sets the address one cycle before the initial address in the address counter 5e (FIG. 6D) for addresses A1SC to A7SC. Then, signals ACUP1, $\overline{\text{ACUP1}}$ (FIG. 6D) go high and low, respectively, allowing the address to be loaded into the register (R1). At this time, when the initial address is odd number, the count-up pulse PULC is outputted, causing the address counter to count up. Furthermore, signals ACUP2, $\overline{\text{ACUP2}}$ (FIG. 6D) go high and low, respectively, allowing the address to be loaded into the register (R2). The address loaded into the register (R2) is the counted-up address when the initial address is odd number, and the same address as that in the register (R1) when the initial address is even number. In a subsequent operation, when the count-up pulse PULC is outputted, either signal ACUP1, $\overline{\text{ACUP1}}$ or signal ACUP2, $\overline{\text{ACUP2}}$ never fails to be outputted alternately. In synchronization with the rising of the count-up pulse PULC, signals SKX, $\overline{\text{SKX}}$ (K=1, 2; X=L, R) (FIG. 6D) are outputted as shown in FIG. 9A. Through the above-described operation, the address signal one cycle previous to the initial address is outputted as the column address signals AiSX, $\overline{\text{AiSX}}$ (i=1 to 7; X=L, R).

Then, at the time when the count-up pulse PULC goes high at the output, the redundant column address signal CSKX goes high when the initial address column is a defective column, causing the redundant-section select signal RECLMX to go high (FIG. 7). As described above, at the time of data reading, it is sensed by the address in previous one cycle whether or not the address in current cycle is that of the defective column which is replaced with the redundant column.

Next, the cycle of outputting the data in the data latch circuit 2 to external terminal I/O PADi 7 begins. The count-up pulse PULC is outputted and an address signal is outputted. When this address is for the defective column, the redundant column address signal CSKX and the redundant-section select signal RECLMX should have been outputted beforehand. As shown in FIG. 9B, when signals $\overline{\text{CENB1}}$, $\overline{\text{CENB2}}$ in FIG. 8B go low, the column activating signal CENB in FIGS. 3A and 3B goes high, and signal CENB3 goes high, the data in the data latch circuit 2 is latched in registers composed of inverters I100, I101, I104, I105. The latched data is outputted to the external output terminal when the read activating signal REP goes high, the signal CENB4 goes high, and output-circuit activating signals OES, $\overline{\text{OES}}$ go high and low, respectively. In synchronization with the read activating signal REP, the least-significant column addresses AOS, $\overline{\text{AOS}}$ are switched. Synchronizing with the odd-numbered rise of the read activating signal REP, a pulse is outputted as the signal CENB4. This starts internal one cycle of the semiconductor memory device.

A data input operation will be described with reference to FIGS. 10A and 10B. The operation of setting a column address to the address (dummy address) one cycle previous to the initial column address before a data input operation is the same as the data read operation. It is the same the data read operation that, at the time of data inputting, it is sensed by the address in previous one cycle whether or not the address in current cycle is that of the defective column which is replaced with the redundant column.

In FIG. 10B, after the initial column address has been read from the external output terminal I/O PADi 7 in FIG. 8A, data input signals DLOAD, $\overline{\text{DLOAD}}$ go high and low, respectively. In synchronization with the write activating signal WESB, the least-significant column addresses AOS, $\overline{\text{AOS}}$ are switched (FIGS. 6B and 6C), and the data latch pulse DLT1 is outputted. As shown in FIG. 8A, on the basis of the least-significant column address AOS, AOS and the data latch pulse DLT1, the write data input from the I/O PADi 7 is taken in the register as data for an even-numbered/odd-numbered column. In synchronization with the even-numbered data latch pulse DLT1, the data latch pulse DLT2 in FIG. 8B is outputted, allowing the write data to be outputted on data input/output lines IOiX, $\overline{\text{IOiX}}$ (i=0 to 7; X=L, R) by the data input signals DLOAD, $\overline{\text{DLOAD}}$. Furthermore, as shown in FIG. 10A, synchronizing with the data latch pulse DLT2, the count-up pulse PULC is outputted. This switches the column address. The column activating signal CENB is outputted before the next data latch pulse DLT2 is outputted. At the even-numbered rise of the write activating signal WESB after the data input signal DLOAD has gone high, internal one cycle is started in the semiconductor memory device.

Address signals AiSX, $\overline{\text{AiSX}}$ (i=0 to 7, X=L, R) are outputted at the beginning of a cycle, and the redundant-column address signal CSKX is outputted earlier than these signals. Being provided with a delay time, the redundant-column address signal CSKX can be outputted simultaneously with address signals AiSX, $\overline{\text{AiSX}}$ at the beginning of the cycle. For instance, when the initial column address is for an odd-numbered column, or when an odd number of data items are inputted, the column select stop signal CXSTOPB (X=L, R) for the columns in which data is not inputted goes low after an odd-numbered write activating signal WESB, causing the last data input cycle to start. In FIGS. 10A and 10B, a case is shown where an odd number of data items are inputted regardless of the initial-column address. However, when an even number of data items are inputted, a normal internal cycle is started, thereby completing the last cycle.

Figure 11:
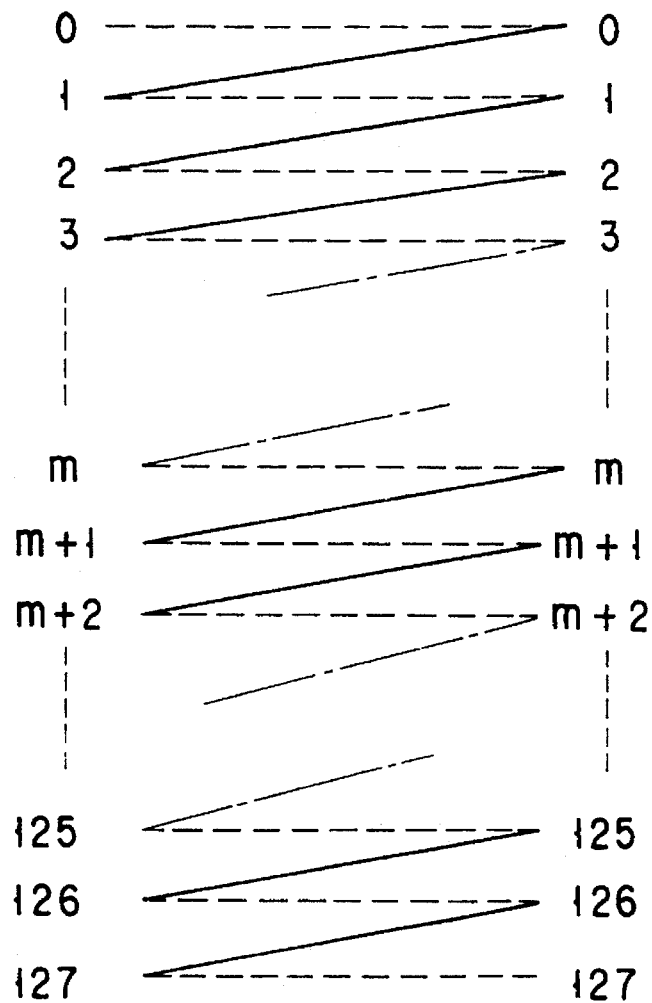
FIG. 11 is a timing chart for the generation sequence of column addresses in the embodiment.

FIG. 11 shows the way of counting up column addresses AiSX, $\overline{\text{AiSX}}$ (i=1 to 7; X=L, R). As in FIGS. 9A, 9B, 10A, and 10B, dotted lines indicate the operation when the start address is even number, and solid lines indicate the operation when it is odd number. Column addresses are generated in such a manner that addresses are connected by dotted or solid lines from top to bottom to form groups.

As described above, with the embodiment, because it is sensed by using the address of the preceding cycle at the time of a data read or input operation whether the address in the current cycle is for the column replaced with the redundant section, one cycle can be shortened. Therefore, it is possible to provide a semiconductor memory device capable of high-speed data input and output.

While in the embodiment, the address storage circuit stores the address one cycle previous to a cycle in which an address signal coinciding with a defective address is outputted, the address is not limited to one-cycle-earlier one. The n-cycle-earlier address may be stored. The address signal generator circuit is not necessarily provided inside the memory device. The address signal may be inputted externally.

As described above, with the present invention, whether or not the address signal after n cycles coincides with a defective-memory cell address is sensed beforehand, and the sensed information (relief information) is outputted after n cycles, at the same time of the output of the address signal. This can relieve defective memory cells without lengthening the access time. Therefore, it is possible to realize a semiconductor memory device capable of high-speed data input and output.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory device comprising:
   a memory cell array in which memory cells are arranged in a matrix fashion and an order of their addresses is determined in advance when being accessed;
   redundant memory cells in said memory cell array for relieving defective memory cells;
   means for storing the address n cycles previous to a cycle to be accessed according to the address of said defective memory cell in said memory cell array;
   means for comparing said address stored in said address storing means with a address signal, and outputting relief information indicating that said redundant memory cells are accessed instead of said defective memory cells when they coincide with each other;
   means for outputting said relief information to the cycle accessed according to said address of said defective memory cells; and
   means for accessing serially said memory cells according to addresses of predetermined order, and accessing said redundant memory cells instead of said defective memory cells according to said relief information when said relief information are outputted.

2. A semiconductor memory device according to claim 1, wherein said outputting means outputs said relief information to said access cycle at the same time when said address signal is switched during said access cycle.

3. A semiconductor memory device according to claim 1, wherein said outputting means outputs said relief information to said access cycle before said address signal is switched during said access cycle.

4. A semiconductor memory device according to claim 1, wherein said redundant memory cells forms redundant columns of said memory cell array, and said address storing means stores defective-column addresses.

5. A semiconductor memory device according to claim 1, wherein said redundant memory cells forms redundant rows of said memory cell array, and said address storing means stores defective-row addresses.

6. A semiconductor memory device according to claim 1, wherein said memory cell array is formed by one of DRAM, ROM, SRAM, and EEPROM cell array.

7. A semiconductor memory device according to claim 1, further comprising means for supplying the address n cycles previous to the cycle to be accessed automatically and externally correspondingly to the input address when said memory cell is accessed.

8. A semiconductor memory device comprising:

a memory cell array in which memory cells are arranged in a matrix fashion and an order of their addresses is determined in advance when being accessed;

redundant memory cells in said memory cell array for relieving defective memory cells;

means for generating the address signal automatically in predetermined order according to the address n cycles previous to the address of the initial cycle to be accessed;

means for storing the address n cycles previous to a cycle to be accessed according to the address of said defective memory cell in said memory cell array;

means for comparing said address stored in said address storing means with a address signal, and outputting relief information indicating that said redundant memory cells are accessed instead of said defective memory cells when they coincide with each other;

means for outputting said relief information to the cycle accessed according to said address of said defective memory cells; and means for accessing serially said memory cells according to addresses of predetermined order, and accessing said redundant memory cells instead of said defective memory cells according to said relief information when said relief information are outputted.

9. A semiconductor memory device according to claim 8, wherein said outputting means outputs said relief information to said access cycle at the same time when said address signal is switched during said access cycle.

10. A semiconductor memory device according to claim 8, wherein said outputting means outputs said relief information to said access cycle before said address signal is switched during said access cycle.

11. A semiconductor memory device according to claim 8, wherein said redundant memory cells forms redundant columns of said memory cell array, and said address storing means stores defective-column addresses.

12. A semiconductor memory device according to claim 8, wherein said redundant memory cells forms redundant rows of said memory cell array, and said address storing means stores defective-row addresses.

13. A semiconductor memory device according to claim 8, wherein said memory cell array is formed by one of DRAM, ROM, SRAM, and EEPROM cell array.

14. A semiconductor memory device comprising:

a memory cell array in which memory cells are arranged in a matrix fashion and an order of their addresses is determined in advance when being accessed;

redundant memory cells in said memory cell array for relieving defective memory cells;

means for generating the address signal automatically in predetermined order according to the address n cycles previous to the start address of the initial cycle to be accessed;

means for setting the address n cycles previous to the start address as an initial address;

means for storing the address n cycles previous to a cycle to be accessed according to the address of said defective memory cell in said memory cell array;

means for comparing said address stored in said address storing means with a address signal, outputting relief information indicating that said redundant memory cells are accessed instead of said defective memory cells when they coincide with each other, and detecting said relief information of n cycles including said start address before the access is started;

means for outputting said relief information to the cycle accessed according to said address of said defective memory cells; and means for accessing serially said memory cells according to addresses of predetermined order, and accessing said redundant memory cells instead of said defective memory cells according to said relief information when said relief information are outputted.

15. A semiconductor memory device according to claim 14, wherein said outputting means outputs said relief information to said access cycle at the same time when said address signal is switched during said access cycle.

16. A semiconductor memory device according to claim 14, wherein said outputting means outputs said relief information to said access cycle before said address signal is switched during said access cycle.

17. A semiconductor memory device according to claim 14, wherein said redundant memory cells forms redundant columns of said memory cell array, and said address storing means stores defective-column addresses.

18. A semiconductor memory device according to claim 14, wherein said redundant memory cells forms redundant rows of said memory cell array, and said address storing means stores defective-row addresses.

19. A semiconductor memory device according to claim 14, wherein said memory cell array is formed by one of DRAM, ROM, SRAM, and EEPROM cell array.

* * * * *